United States Patent
Kuraoka et al.

(10) Patent No.: US 9,882,042 B2
(45) Date of Patent: Jan. 30, 2018

(54) GROUP 13 NITRIDE COMPOSITE SUBSTRATE SEMICONDUCTOR DEVICE, AND METHOD FOR MANUFACTURING GROUP 13 NITRIDE COMPOSITE SUBSTRATE

(71) Applicant: NGK INSULATORS, LTD., Aichi (JP)

(72) Inventors: Yoshitaka Kuraoka, Okazaki (JP); Mikiya Ichimura, Ichinomiya (JP); Makoto Iwai, Kasugai (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 14/657,704

(22) Filed: Mar. 13, 2015

(65) Prior Publication Data
US 2015/0187926 A1 Jul. 2, 2015

Related U.S. Application Data

(63) Continuation of application No. PCT/JP2014/064420, filed on May 30, 2014.

(Continued)

(51) Int. Cl.
*H01L 21/02* (2006.01)
*H01L 29/778* (2006.01)
(Continued)

(52) U.S. Cl.
CPC ...... *H01L 29/7787* (2013.01); *H01L 21/0254* (2013.01); *H01L 21/0262* (2013.01);
(Continued)

(58) Field of Classification Search
CPC ............... H01L 29/201; H01L 29/7787; H01L 29/1033; H01L 21/0254; H01L 21/02389;
(Continued)

(56) References Cited

U.S. PATENT DOCUMENTS 6,924,159 B2   8/2005   Usui et al.
7,112,830 B2 *  9/2006   Munns .................. H01L 29/155
                                                                      257/12

(Continued)

FOREIGN PATENT DOCUMENTS

CN    101009326 A    8/2007
CN      1977366 B   10/2010

(Continued)

OTHER PUBLICATIONS

Office Action from Taiwan Patent App. No. 10620472740 (May 2, 2017).

(Continued)

*Primary Examiner* — Bitew Dinke
(74) *Attorney, Agent, or Firm* — Cermak Nakajima & McGowan LLP; Tomoko Nakajima (57) ABSTRACT

Provided are a group 13 nitride composite substrate allowing for the production of a semiconductor device suitable for high-frequency applications while including a conductive GaN substrate, and a semiconductor device produced using this substrate. The group 13 nitride composite substrate includes a base material of an n-conductivity type formed of GaN, a base layer located on the base material, being a group 13 nitride layer having a resistivity of $1 \times 10^6$ Ω·cm or more, a channel layer located on the base layer, being a GaN layer having a total impurity density of $1 \times 10^{17}/cm^3$ or less, and a barrier layer that is located on the channel layer and is formed of a group 13 nitride having a composition $Al_xIn_yGa_{1-x-y}N$ ($0 \leq x \leq 1$, $0 \leq y \leq 1$).

2 Claims, 1 Drawing Sheet

Related U.S. Application Data (60) Provisional application No. 61/831,671, filed on Jun. 6, 2013.

(51) Int. Cl.

| | |
|---|---|
| *H01L 29/66* | (2006.01) |
| *H01L 29/20* | (2006.01) |
| *H01L 29/10* | (2006.01) |
| *H01L 29/201* | (2006.01) |
| *H01L 29/205* | (2006.01) |
| *H01L 29/207* | (2006.01) |

(52) U.S. Cl.
CPC .. *H01L 21/02389* (2013.01); *H01L 21/02579* (2013.01); *H01L 21/02581* (2013.01); *H01L 29/1029* (2013.01); *H01L 29/1033* (2013.01); *H01L 29/201* (2013.01); *H01L 29/2003* (2013.01); *H01L 29/205* (2013.01); *H01L 29/207* (2013.01); *H01L 29/66462* (2013.01); *H01L 29/7783* (2013.01); *H01L 29/7786* (2013.01)

(58) Field of Classification Search
CPC ............ H01L 29/205; H01L 21/0262; H01L 29/66462; H01L 29/2003; H01L 21/02579; H01L 21/02581; H01L 29/207
See application file for complete search history.

(56) References Cited

U.S. PATENT DOCUMENTS

| | | | |
|---|---|---|---|
| 7,749,828 B2 | 7/2010 | Hashimoto et al. | |
| 7,884,393 B2 | 2/2011 | Hashimoto et al. | |
| 8,378,386 B2 | 2/2013 | Miyoshi et al. | |
| 2002/0096692 A1* | 7/2002 | Nakamura | H01L 21/02378 257/194 |
| 2005/0087751 A1 | 4/2005 | Nakamura et al. | |
| 2006/0214193 A1* | 9/2006 | Hayamura | H01L 29/66462 257/213 |
| 2007/0033630 A1 | 2/2007 | Reznik et al. | |
| 2009/0189190 A1 | 7/2009 | Hashimoto et al. | |
| 2010/0230723 A1 | 9/2010 | Hashimoto et al. | |
| 2010/0244018 A1* | 9/2010 | Kaneko | H01L 29/4232 257/43 |
| 2010/0289067 A1* | 11/2010 | Mishra | H01L 29/2003 257/268 |
| 2011/0006308 A1 | 1/2011 | Sato | |
| 2011/0042787 A1* | 2/2011 | Sato | H01L 29/201 257/615 |
| 2011/0240962 A1* | 10/2011 | Ikuta | C30B 25/18 257/15 |
| 2011/0254014 A1* | 10/2011 | Tsuchiya | H01L 29/66462 257/76 |
| 2011/0274609 A1 | 11/2011 | Shimodaira et al. | |
| 2012/0299060 A1* | 11/2012 | Kohda | H01L 21/02381 257/190 |
| 2013/0001585 A1* | 1/2013 | Tsuchiya | H01L 29/861 257/76 |
| 2013/0015466 A1* | 1/2013 | Miyoshi | H01L 21/0237 257/76 |
| 2013/0175543 A1* | 7/2013 | Kiyama | H01L 21/02389 257/76 |
| 2014/0015608 A1* | 1/2014 | Kotani | H01L 29/2003 330/277 |
| 2014/0061665 A1* | 3/2014 | Tsuchiya | H01L 21/02458 257/76 |
| 2014/0374771 A1* | 12/2014 | Umeno | H01L 29/201 257/76 |

FOREIGN PATENT DOCUMENTS

| | | | | |
|---|---|---|---|---|
| EP | 1777737 | A1 | 4/2007 | |
| JP | 2002-057158 | A | 2/2002 | |
| JP | 2003-197643 | A | 7/2003 | |
| JP | 3631724 | B2 | 12/2004 | |
| JP | 2006-332367 | A | 12/2006 | |
| JP | 2007-096261 | A | 4/2007 | |
| JP | 2010-062168 | A | 3/2010 | |
| JP | 2010-166014 | A | 7/2010 | |
| JP | 2011-049467 | A | 3/2011 | |
| JP | 2011068548 | A * | 4/2011 | |
| JP | 2011068548 | A * | 4/2011 | |
| JP | WO 2011118433 | A1 * | 9/2011 | ......... H01L 21/0237 |
| JP | 2012-064951 | A | 3/2012 | |
| JP | 5039813 | B2 | 7/2012 | |
| JP | 2012-199398 | A | 10/2012 | |
| WO | WO2010/084675 | A1 | 7/2010 | |
| WO | WO2012/127738 | A1 | 9/2012 | |

OTHER PUBLICATIONS

Supplementary Partial European Search Report for European Patent App. No. 14807779.5 (Feb. 9, 2017).
International Preliminary Report on Patentability for PCT Patent App. No. PCT/JP2014/064420 (Dec. 17, 2015) with English language translation thereof.
Extended European Search Report for EP Patent App. No. 14807779.5 (May 8, 2017).
Kanamura, M., "A 100-W High-Gain AlGaN/GaN HEMT Power Amplifier on a Conductive N-SiC Substrate for Wireless Base Station Applications," Tech. Dig. of 2004 IEEE International Electron Device Meeting (IEDM2008), pp. 799-902.
Kikkawa, T., "Highly Reliable 250 W GaN High Electron Mobility Transistor Power Amplifier," Japanese J. Appl. Phys. 2005;44(7A):4896-4901.
International Search Report for PCT Patent App. No. PCT/JP2014/064420 (Aug. 26, 2014).
Office Action from Japanese Patent App. No. 2015-521425 issued on Sep. 19, 2017.
Office Action from Chinese Patent App. No. 201480025003.9 (Dec. 4, 2017).

* cited by examiner

GROUP 13 NITRIDE COMPOSITE SUBSTRATE SEMICONDUCTOR DEVICE, AND METHOD FOR MANUFACTURING GROUP 13 NITRIDE COMPOSITE SUBSTRATE

TECHNICAL FIELD

The present invention relates to a semiconductor device, and particularly, to a group 13 nitride composite substrate allowing for the production of semiconductor devices suitable for high-frequency applications.

BACKGROUND ART

Nitride semiconductors, which have high breakdown electric field and high saturation electron velocity, have been attracting attention as the next-generation semiconductor materials for high-frequency/high-power devices. In particular, a multi-layer structure, which is formed by laminating a layer composed of AlGaN and a layer composed of GaN, produces a high two-dimensional electron gas (2DEG) at a lamination interface (hetero interface) owing to large polarization effects (spontaneous polarization effect and piezo polarization effect) inherent in nitride materials, and thus, high electron mobility transistors (HEMTs) including such a multi-layer structure as a substrate have been vigorously developed (for example, see Non-Patent Document 1).

HEMTs, which are operated under the conditions of high power and high frequency (100 W or more, 2 GHz or more) such as ones for mobile phone base stations, are desirably produced using materials having heat resistant as low as possible to limit a temperature rise of a device due to heating. Contrastingly, HEMTs, which perform a high-frequency operation, are desirably produced using highly insulating materials because they need to reduce parasitic capacitance as much as possible. In the production of a device that satisfies the above-mentioned requirements using a nitride semiconductor, a semi-insulating SiC substrate having a resistivity as high as $1 \times 10^8$ Ω·cm or more is used as a base substrate because such a substrate allows for the deposition of a good nitride film.

It is proposed to deposit an insulating AlN film on a conductive SiC substrate by the method such as the hydride vapor phase epitaxy method (HVPE method) or the MOCVD method and use it as a base substrate (for example, see Non-Patent Document 2).

In the technique disclosed in Non-Patent Document 2, however, since the crystal quality of a nitride epitaxial film formed on the base substrate depends on the quality of the AlN film formed by the HVPE method, the quality of the AlN film is required to be improved for improved quality of the nitride epitaxial film. Unfortunately, it is difficult to control the deposition of the AlN film by the HVPE method in such a way that the crystal quality (such as dislocation density) becomes uniform over the entire wafer in the deposition, leading to inplane variations in characteristics of an epitaxial film, further, of a device.

The approach capable of achieving effects similar to those in the case of using a semi-insulating SiC substrate with the use of a base substrate including a vanadium-doped semi-insulating SiC film formed on a conductive SiC substrate has been known (for example, see Patent Document 1).

In recent years, gallium nitride (GaN) substrates expected to have improved performance and reliability have been in practical use as the base substrate for HEMT device. The approach of manufacturing a GaN substrate by the gas phase process or liquid phase process has been known (for example, see Patent Documents 2 and 3).

As described above, in use of a nitride semiconductor for high-frequency application, it is desirable that the substrate be free from parasitic capacitance. Thus, a semi-insulating GaN substrate is desirably used even in the use of a GaN substrate, but now, a semi-insulating GaN substrate is expensive and is hard to obtain. In contrast, a conductive gallium nitride substrate is relatively inexpensive and is easy to obtain because conductive gallium nitride substrates are in mass production for vertical LDs.

An approach of forming a carbon (C) doped GaN layer on a conductive GaN substrate to obtain a GaN substrate that can be used for high-frequency applications, in which the above-mentioned problem is taken into consideration, has been known (for example, see Patent Document 4). In the technique disclosed in Patent Document 4, however, the C concentration of an electron transit layer becomes higher, which makes it difficult to improve device performance.

There is a known technique of doping zinc (Zn) to obtain a high-resistance nitride single crystal (for example, see Patent Document 5).

PRIOR ART DOCUMENTS

Patent Documents

Patent Document 1: Japanese Patent Application Laid-Open No. 2010-062168
Patent Document 2: Japanese Patent No. 3631724
Patent Document 3: International Publication No. 2010/084675
Patent Document 4: Japanese Patent Application Laid-Open No. 2012-199398
Patent Document 5: Japanese Patent No. 5039813

Non-Patent Documents

Non-Patent Document 1: "Highly Reliable 250 W GaN High Electron Mobility Transistor Power Amplifier", T. Kikkawa, Japanese Journal of Applied Physics, Vol. 44, No. 7A, 2005, pp. 4896-4901.
Non-Patent Document 2: "A 100-W High-Gain AlGaN/GaN HEMT Power Amplifier on a Conductive N—SiC Substrate for Wireless Bass Station Applications", M. Kanamura, T. Kikkawa, and K. Joshin, Tech. Dig. of 2004 IEEE International Electron Device Meeting (IEDM2008), pp. 799-802.

SUMMARY OF INVENTION

The present invention has been made in view of the above-mentioned problem, and has an object to provide a group 13 nitride composite substrate allowing for the production of a semiconductor device suitable for high-frequency application while including a conductive GaN substrate, and a semiconductor device produced using the group 13 nitride composite substrate.

To solve the above-mentioned problem, in a first aspect of the present invention, a group 13 nitride composite substrate includes: a base material of an n-conductivity type formed of GaN; a base layer located on the base material, the base layer being a group 13 nitride layer having a resistivity of $1 \times 10^6$ Ω·cm or more; a channel layer located on the base layer, the channel layer being a GaN layer having a total impurity concentration of $1 \times 10^{17}/cm^3$ or less; and a barrier layer located on the channel layer, the barrier layer being formed of a group 13 nitride having a composition $Al_xIn_yGa_{1-x-y}N$ ($0 \le x \le 1$, $0 \le y \le 1$).

In a second aspect of the present invention, in the group 13 nitride composite substrate according to the first aspect, the base layer is a Zn-doped GaN layer being a GaN layer containing Zn doped at a density of $1 \times 10^{18}/cm^3$ or more and $2 \times 10^{19}/cm^3$ or less.

In a third aspect of the present invention, in the group 13 nitride composite substrate according to the first aspect, the base layer is a C-containing GaN layer being a GaN layer containing C at a density of $8 \times 10^{16}/cm^3$ or more and $3 \times 10^{18}/cm^3$ or less.

In a fourth aspect of the present invention, in the group 13 nitride composite substrate according to the first aspect, the base layer is an AlGaN layer formed of $Al_pGa_{1-p}N$ ($0.1 \le p \le 0.98$).

In a fifth aspect of the present invention, a semiconductor device includes the group 13 nitride composite substrate according to the first aspect, a source electrode and a drain electrode that are located on the barrier layer of the group 13 nitride composite substrate and have ohmic contact with the barrier layer, and a gate electrode located on the barrier layer of the group 13 nitride composite substrate and has Schottky contact with the barrier layer.

In a sixth aspect of the present invention, a method for manufacturing a group 13 nitride composite substrate includes: a base layer forming step of forming, on a base material of an n-conductivity type formed of GaN, a base layer being a group 13 nitride layer having a resistivity of $1 \times 10^6$ Ω·cm or more; a channel layer forming step of forming, on the base layer, a channel layer being a GaN layer having a total impurity concentration of $1 \times 10^{17}/cm^3$ or less; and a barrier layer forming step of forming, on the channel layer, a barrier layer formed of a group 13 nitride having a composition $Al_xIn_yGa_{1-x-y}N$ ($0 \le x \le 1$, $0 \le y \le 1$).

In a seventh aspect of the present invention, in the method for manufacturing a group 13 nitride composite substrate according to the sixth aspect, the base layer forming step is a Zn-doped GaN layer forming step of forming, as the base layer, a GaN layer containing Zn doped at a density of $1 \times 10^{18}/cm^3$ or more and $2 \times 10^{19}/cm^3$ or less.

In an eighth aspect of the present invention, in the method for manufacturing a group 13 nitride composite substrate according to the sixth aspect, the base layer forming step is a C-containing GaN layer forming step of forming, as the base layer, a GaN layer containing C at a density of $8 \times 10^{16}/cm^3$ or more and $3 \times 10^{18}/cm^3$ or less.

In a ninth aspect of the present invention, in the method for manufacturing a group 13 nitride composite substrate according to the sixth aspect, the base layer forming step is an AlGaN layer forming step of forming, as the base layer, an AlGaN layer of $Al_pGa_{1-p}N$ ($0.1 \le p \le 0.98$).

According to the first to ninth aspects, a group 13 nitride composite substrate allowing for the production of a semiconductor device suitable for high-frequency applications while including a conductive GaN substrate as a base material, and further, the semiconductor device can be obtained. The semiconductor device has high mobility while the capacitance between gate and source electrodes (gate-source capacitance) thereof is reduced.

In particular, according to the second to fourth and seventh to ninth aspects, a group 13 nitride composite substrate allowing for the production of a semiconductor device suitable for high-frequency applications while including a conductive GaN substrate as a base material, and further, the semiconductor device can be obtained. The semiconductor device has a mobility as high as 1000 $cm^2$/V·s or more while the gate-source capacitance thereof is reduced to less than 0.1 pF.

EMBODIMENT FOR CARRYING OUT THE INVENTION

The group numbers of the periodic table in this specification are according to the explanation of group numbers 1 to 18 in the nomenclature of inorganic chemistry revised in 1989 by the international union of pure applied chemistry (IUPAC). Group 13 refers to, for example, aluminum (Al), gallium (Ga), and indium (In), and group 15 refers to, for example, nitrogen (N), phosphorous (P), arsenic (As), and antimony (Sb).

<Configurations of Composite Substrate and HEMT Device>

Figure 1:
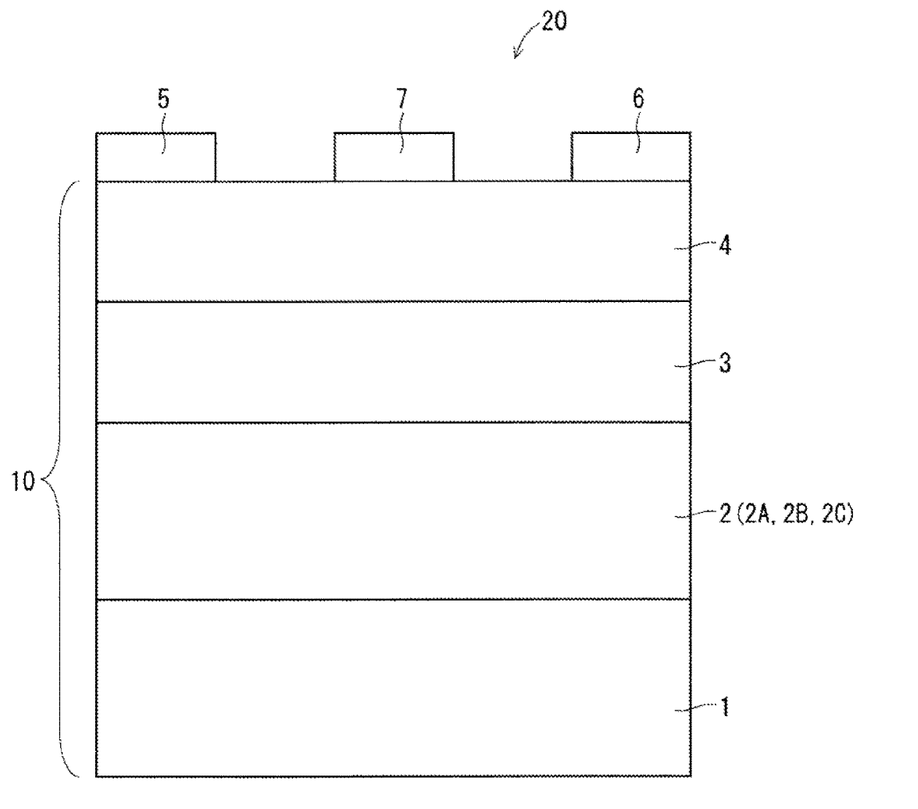
FIG. 1 schematically illustrates the cross-sectional structure of a HEMT device 20 including a group 13 nitride composite substrate 10.

FIG. 1 schematically illustrates the cross-sectional structure of a HEMT device 20 as an embodiment of a semiconductor device according to the present invention, which includes a group 13 nitride composite substrate 10 as an embodiment of a group 13 nitride (group III nitride) composite substrate according to the present invention.

The group 13 nitride composite substrate 10 includes a base material seed substrate) 1, a base layer (high-resistance layer) 2 (2A, 2B, or 2C), a channel layer (low-impurity layer) 3, and a barrier layer 4. The HEMT device 20 includes a source electrode 5, a drain electrode 6, and a gate electrode 7 disposed on the group 13 nitride composite substrate 10 (on the barrier layer 4). The ratios of the respective layers in FIG. 1 do not reflect the actual ones. The configuration of the group 13 nitride composite substrate 10, in which the barrier layer 4 is disposed on the channel layer 3, may be referred to as a HEMT structure below.

The base material 1 is a GaN substrate that has a resistivity of 1 Ω·cm or less, has an n-conductivity type, and has a (0001) plane orientation. Although the thickness of the base material 1 is not particularly limited, it is preferably about several hundreds of μm to several mm in consideration of, for example, ease of handling. Bulk GaN produced by, for example, a known technique such as the HVPE method may be used as the base material 1.

The base layer 2 is a high-resistance (semi-insulating) group 13 nitride layer having a resistivity of $1 \times 10^6$ Ω·cm or more. The base layer 2 is preferably provided with a thickness of 8 μm or more, and more preferably, with a thickness of 10 μm or more and 200 μm or less.

The base layer 2 is preferably any one of a Zn-doped GaN layer 2A, a C-containing GaN layer 2B, and an AlGaN layer 2C. Each of the layers will be described in detail below.

The channel layer 3 is a GaN layer having a total impurity concentration of $1 \times 10^{17}/cm^3$ or less, which is formed by the MOCVD method. The channel layer 3 has an impurity concentration smaller than, at least, that of the base layer 2.

Typical impurity in the channel layer 3 are C. Thus, the channel layer 3, which has a C concentration of less than $1 \times 10^{17}/cm^3$, can be virtually regarded to have a total impurity concentration of $1 \times 10^{17}/cm^3$ or less. The channel layer 3 is preferably provided with a thickness of 0.05 μm or more and 5 μm or less.

The barrier layer 4 is a group 13 nitride layer having a composition $Al_xIn_yGa_{1-x-y}N$ ($0 \leq x \leq 1$, $0 \leq y \leq 1$), which is formed by the MOCVD method. The bather layer 4 is preferably formed to have a thickness of 5 to 30 nm The source electrode 5 and the drain electrode 6 are metal electrodes each having a thickness of about ten and several nm to a hundred and several tens of nm. The source electrode 5 and the drain electrode 6 have ohmic contact with the barrier layer 4.

The source electrode 5 and the drain electrode 6 are preferably formed as multilayer electrodes of, for example, Ti/Al/Ni/Au. In such a case, the Ti film, Al film, Ni film, and Au film preferably have thicknesses of about 10 to 50 nm, 50 to 200 nm, 10 to 50 nm, and 500 to 1000 nm, respectively.

The gate electrode 7 is a metal electrode having a thickness of about ten and several nm to a hundred and several tens of nm. The gate electrode 7 has Schottky contact with the barrier layer 4.

The gate electrode 7 is preferably formed as a multilayer electrode of, for example, Pd/Au. In such a case, the Pd film and the Au film preferably have thicknesses of about 5 to 50 nm and 50 to 500 nm, respectively.

Providing the above-mentioned configuration, specifically, providing the base layer 2 being a high-resistance layer on the base material 1 being a conductive GaN substrate and then sequentially providing the channel layer 3 being a low-impurity layer and the bather layer 4 thereon, allows the HEMT device 20 according to this embodiment to have a mobility as high as 1000 $cm^2/V \cdot s$ or more while the gate-source capacitance is reduced to less than 0.1 pF. These characteristic values are preferable ones so that the HEMT device 20 can be used for high-frequency applications. In particular, since the gate-source capacitance becomes parasitic capacitance and degrades high-frequency characteristics, the capacitance preferably has a small value when the HEMT device 20 is used for high-frequency applications.

The HEMT device 20 according to this embodiment can be preferably used for high-frequency applications while it includes a conductive GaN substrate as the base material 1. The group 13 nitride composite substrate 10 according to this embodiment allows for the production of a HEMT device to be preferably used for high-frequency applications while it includes a conductive GaN substrate as the base material 1.

<Detailed Configuration of Base Layer>

As described above, the base layer 2 is preferably any one of the Zn-doped GaN layer 2A, C-containing GaN layer 2B, and AlGaN layer 2C. Each of these layers will now be described in detail.

The Zn-doped GaN layer 2A is a GaN layer formed by doping Zn (zinc) by the flux method (sodium flux method). The Zn-doped GaN layer 2A preferably has a Zn concentration of $1 \times 10^{18}/cm^3$ or more and $2 \times 10^{19}/cm^3$ or less. In such a case, resistivity is $1 \times 10^7$ $\Omega \cdot cm$ or more, mobility is 1150 $cm^2/V \cdot s$ or more, and the gate-source capacitance falls below 0.1 pF.

The Zn-doped GaN layer 2A, whose Zn concentration is set to be less than $1 \times 10^{18}/cm^3$, has higher mobility but undesirably has a gate-source capacitance exceeding 0.1 pF. The Zn concentration set to be more than $2 \times 10^{19}/cm^3$ undesirably leads to a small mobility. It is conceivable that mobility will decrease when the Zn concentration exceeds $2 \times 10^{19}/cm^3$ because the crystallinity of the Zn-doped GaN layer 2A decreases and the crystallinity of the channel layer 3 accordingly decreases as well.

The C-containing GaN layer 2B is a GaN layer formed to intentionally contain C (carbon) as impurities by the metal organic chemical vapor phase deposition method (MOCVD method). The C-containing GaN layer 2B preferably has a C concentration of $8 \times 10^{16}/cm^3$ or more and $3 \times 10^{18}/cm^3$ or less. In such a case, resistivity is $3 \times 10^6$ $\Omega \cdot cm$ or more, mobility is 1250 $cm^2/V \cdot s$ or more, and the gate-source capacitance falls below 0.1 pF.

The C-containing GaN layer 2B, whose C concentration is set to be less than $8 \times 10^{16}/cm^3$, has higher mobility but undesirably has a gate-source capacitance exceeding 0.1 pF. The C concentration set to be more than $3 \times 10^{18}/cm^3$ undesirably leads to a small mobility. It is conceivable that mobility will decrease when the C concentration exceeds $3 \times 10^{18}/cm^3$ because the crystallinity of the C-containing GaN layer 2B decreases and the crystallinity of the channel layer 3 accordingly decreases as well.

The AlGaN layer 2C is a layer formed of $Al_pGa_{1-p}N$ by the MOCVD method. It is preferable that $0.1 \leq p \leq 0.98$. In such a case, resistivity is $2 \times 10^6$ $\Omega \cdot cm$ or more, mobility is 1050 $cm^2/V \cdot s$ or more, and the gate-source capacitance falls below 0.1 pF.

The AlGaN layer 2C, whose Al compositional ratio p is set to be less than 0.1, has higher mobility but undesirably has a gate-source capacitance exceeding 0.1 pF. The Al compositional ratio set to be more than 0.98 undesirably leads to a small mobility. It is conceivable that mobility will decrease when the Al compositional ratio exceeds 0.98 because minute cracks appear in the channel layer and the crystallinity of the channel layer accordingly decreases.

As described above, the HEMT device 20 according to this embodiment can achieve a mobility as high as 1000 $cm^2/V \cdot s$ or more even if the base layer 2 is formed as any one of the Zn-doped GaN layer 2A, the C-containing GaN layer 2B, and the AlGaN layer 2C, whereas the gate-source capacitance is reduced down to less than 0.1 pF.

<Procedure of Producing Composite Substrate and HEMT Device>

Next, the procedure of producing the group 13 nitride composite substrate 10 and the HEMT device 20 that have the configurations described above will be described. Since it is preferable in this embodiment that any one of the Zn-doped GaN layer 2A, the C-containing GaN layer 2B, and the AlGaN layer 2C be formed on the base material 1 as the base layer 2 as described above, the methods of forming the Zn-doped GaN layer 2A, the C-containing GaN layer 2B, and the AlGaN layer 2C will be individually described as the method of forming the base layer 2, and then, the formation of the channel layer 3 and the barrier layer 4 on the base layer 2 will be described.

(Formation of Zn-doped GaN Layer)

The Zn-doped GaN layer 2A is produced by the flux method. Specifically, a GaN substrate being the base material 1 is prepared. Then, the base material 1 being a seed crystal, 20 to 70 g of metal Ga, 40 to 120 g of metal Na, and 0.1 to 5 g of metal Zn are charged into an alumina crucible. Subsequently, the alumina crucible is placed in a heat-resistant metal growing vessel and is then sealed.

Then, in the heat-resistance, pressure-tight crystal growing furnace whose furnace temperature has been set to 800 to 900° C. and whose furnace pressure has been set to 3 to 10 MPa, into which a nitrogen gas has been introduced, the growing vessel is held for 20 to 100 hours while being horizontally rotated. With this holding, a GaN single-crystal layer containing doped Zn is deposited to have a thickness of about 100 to 500 μm on the base material 1 while a melt containing the metal Ga, the metal Na, and the metal Zn is being stirred.

The furnace is cooled slowly to room temperature, and then, the base material 1 on which a Zn-doped GaN single crystal layer has deposited (composite substrate) is taken out of the alumina crucible.

Subsequently, the surface of the formed Zn-doped GaN single crystal layer is planarized with diamond abrasive grains such that the layer has a thickness of 10 to 100 μm. This completes the formation of the Zn-doped GaN layer 2A.

If the single crystal layer grown by the flux method has a thickness of less than 10 μm, it is difficult to planarize the surface of the single crystal layer and regulate the thickness thereof at a constant value. Therefore, the single crystal layer grown by the flux method preferably has a thickness of 10 μm or more.

(Formation of C-Containing GaN Layer)

The C-containing GaN layer 2B is formed by the MOCVD method. In the formation of the C-containing GaN layer 2B, a known MOCVD furnace is used that is configured such that its reactor is supplied with at least a metal organic (MO) source gas for Ga (TMG), an ammonia gas being a source gas of N, a hydrogen gas, and a nitrogen gas. Needless to say, the MOCVD furnace may be configured to be supplied with other source gas.

Specifically, a GaN substrate being the base material 1 is first prepared and is placed on the susceptor provided in the reactor. Then, the susceptor is heated to set the base material 1 to a predetermined temperature (C-containing GaN layer forming temperature) of 1000° C. or higher and 1150° C. or lower. At the same time, while keeping the reactor pressure at a predetermined value of 10 kPa or more and 50 kPa or less, the supply of TMG and an ammonia gas being source gases, and further, a carrier gas is adjusted such that a gas ratio of group 15 to group 13 has a predetermined value of 100 or more and 2000 or less. As a result, the C-containing GaN layer 2B having a desired C concentration is formed on the surface of the base material 1.

In the formation of a GaN layer by the MOCVD method, the C concentration thereof varies depending on a value of the gas ratio of group 15 to group 13. This phenomenon is employed in the formation of the C-containing GaN layer 2B in this embodiment. That is, the GaN layer is caused to contain a desired concentration of C by appropriately adjusting the reactor pressure and the gas ratio of group 15 to group 13 in the formation of a GaN layer.

For example, the C concentration of the C-containing GaN layer 2B is $5 \times 10^{16}/cm^3$ in the case where the reactor pressure is set to 100 kPa and the gas ratio of group 15 to group 13 is set to 1000, and the C concentration of the C-containing GaN layer 2B is $5 \times 10^{18}/cm^3$ in the case where the reactor pressure is set to 10 kPa and the gas ratio of group 15 to group 13 is set to 100. The C concentration of the C-containing GaN layer 2B can vary depending on the value of the gas ratio of group 15 to group 13 because the C supply amount varies depending on the supply amount of a group 13 gas and the stability of the C element of a GaN crystal is subject to temperature and pressure.

In this embodiment, the gas ratio of group 15 to group 13 is a ratio (molar ratio) of the supply amount of a group 15 source to the supply amount of a group 13 source. In the formation of the C-containing GaN layer 2B, the molar ratio of the supply amount of an ammonia gas being an N source to the supply amount of TMG being a Ga source corresponds to the gas ratio of group 15 to group 13.

(Formation of AlGaN Layer)

The AlGaN layer 2C is formed by the MOCVD method, similarly to the formation of the C-containing GaN layer 2B.

Thus, in the formation of the AlGaN layer 2C, an MOCVD furnace similar to that in the formation of the C-containing GaN layer 2B can be used if it can be also supplied with a metal organic (MO) source gas for Al (TMA). Needless to say, the MOCVD furnace may be configured to be supplied with other source gas.

Specifically, a GaN substrate being the base material 1 is first prepared and is placed on the susceptor provided in the reactor. Then, the susceptor is heated to set the base material 1 to a predetermined temperature (AlGaN layer forming temperature) of 1050° C. or higher and 1200° C. or lower. At the same time, while keeping the reactor pressure at a predetermined value of 5 kPa or more and 30 kPa or less, the supply of TMG and TMA being source gases and an ammonia gas, and further, a carrier gas is adjusted such that a gas ratio of group 15 to group 13 has a predetermined value of 500 or more and 5000 or less. As a result, the AlGaN layer 2C is formed on the surface of the base material 1.

To set the Al compositional ratio p of the AlGaN layer 2C to a predetermined value, the ratio of the Al source gas (TMA) to the group 13 source gas, namely, the ratio of the flow of TMA to the flow of the entire group 13 source gas (a total sum of the flow of TMA and TMG), may be adjusted to agree with a desired compositional ratio. If such a flow rate ratio is represented as TMA/(TMA+TMG) ratio, for example, the Al compositional ratio p of the AlGaN layer 2C is 0.1 for the TMA/(TMA+TMG) ratio set to 0.1, and is 0.98 for the TMA/(TMA+TMG) ratio set to 0.98.

(Formation of Channel Layer and Subsequent Ones)

After the formation of the base layer 2 by any of the approaches described above, the channel layer 3 and the barrier layer 4 are formed in sequence. The channel layer 3 and the bather layer 4 are formed by the MOCVD method. Preferably, the channel layer 3 and the barrier layer 4 are successively formed in a single MOCVD furnace. To form the C-containing GaN layer 2B or AlGaN layer 2C as the base layer 2, it is preferable to sequentially form layers including these layers in a single MOCVD furnace.

To form the channel layer 3 and the barrier layer 4, a known MOCVD furnace is used that is configured such that its reactor can be supplied with metal organic (MO) source gases for group 13 elements (Ga, Al, In) (TMG, TMA, TMI), an ammonia gas being the source gas of nitrogen (N), a hydrogen gas, and a nitrogen gas.

To form the channel layer 3, the composite substrate after the formation of the base layer 2 is first placed on the susceptor provided in the reactor. Then, the susceptor is heated to set the composite substrate to a predetermined temperature (channel layer forming temperature) of 1000° C. or higher and 1150° C. or lower. At the same time, while keeping the reactor pressure at a predetermined value of 50 kPa or more and 100 kPa or less, the supply of TMG and an ammonia gas being source gases, and a carrier gas is adjusted such that the gas ratio of group 15 to group 13 has a predetermined value of 1000 or more and 5000 or less. As a result, the channel layer 3 is formed.

To form the barrier layer 4 subsequent to the formation of the channel layer 3, the composite substrate after the formation of the channel layer 3 is set to a predetermined temperature (barrier layer forming temperature) of 1050° C. or higher and 1200° C. or lower. At the same time, while keeping the reactor pressure at a predetermined value of 5 kPa or more and 30 kPa or less, the supply of TMG, TMA, TMI, and an ammonia gas being source gases and a carrier gas is adjusted depending on the composition of the barrier layer 4 such that the gas ratio of group 15 to group 13 is 5000 or more and 50000 or less. As a result, the barrier layer 4 is formed.

As the result of the formation of the barrier layer 4, the group 13 nitride composite substrate 10 according to this embodiment has been obtained.

After the formation of the group 13 nitride composite substrate 10, the HEMT device 20 is formed using this substrate. The following steps will be performed by a known technique.

First, a multilayer film of Ti/Al/Ni/Au is formed at locations for formation on the barrier layer 4 by the photolithography process and the vacuum deposition method, thereby forming a multilayer metal that will serve as the source electrode 5 and the drain electrode 6.

Subsequently, to provide good ohmic property to the source electrode 5 and the drain electrode 6, the group 13 nitride composite substrate 10 on which the source electrode 5 and the drain electrode 6 have been formed is heat-treated for several tens of seconds in a nitrogen gas atmosphere at a predetermined temperature of 650 to 1000° C.

Subsequently, a multilayer film of Pd/Au is formed at a location for formation on the bather layer 4 by the photolithography process and the vapor deposition method, thereby forming a multilayer metal that will serve as the gate electrode 7.

As described above, in this embodiment, the base layer being a high-resistance layer is provided on the base material being a conductive GaN substrate, and then, the channel layer being a low-impurity layer and the barrier layer are provided thereon in sequence, thereby forming a HEMT device having a mobility as high as 1000 cm$^2$/V·s or more while the gate-source capacitance thereof is reduced to less than 0.1 pF. In other words, this embodiment enables a group 13 nitride composite substrate allowing for the production of a HEMT device suitable for high-frequency applications while including a conductive GaN substrate as a base material, and further enables a HEMT device suitable for high-frequency applications.

EXAMPLES

Example 1

In this example, a Zn-doped GaN layer 2A was formed as a base layer 2 to produce a group 13 nitride composite substrate 10, and further, the group 13 nitride composite substrate 10 was used to produce a HEMT device 20. Then, several characteristics were evaluated during and after the production.

More specifically, in this example, six types of group 13 nitride composite substrates 10 were produced on different conditions for the Zn concentration of the Zn-doped GaN layer 2A, and HEMT devices 20 for the respective substrates 10 were produced (Nos. 1-1 to 1-6). In the following description, a GaN layer from which Zn is not detected may be referred to as a Zn-doped GaN layer 2A for convenience sake.

A so-called multi-patterning process capable of producing a large number of devices from a single mother substrate was employed in the production of the HEMT devices 20.

In the production of a sample under any condition, first, a 4-in.-diam. conductive GaN substrate of an n-conductivity type having a (0001) plane orientation was prepared as the mother substrate that serves as the base material 1. The resistivity of this GaN substrate was 0.1 Ω·cm.

Then, the conductive GaN substrate, a metal Ga, a metal Na, and a metal Zn were charged into an alumina crucible. On this occasion, the charge amounts of the metal Ga and metal Na were 45 g and 66 g, respectively, whereas the charge amount of the metal Zn was varied for each condition to vary Zn concentration. Specifically, the charge amounts of the samples 1-1 to 1-6 were 0 g (no charge), 0.1 g, 0.2 g, 0.5 g, 2 g, and 5 g, respectively.

After that, the alumina crucibles on the respective conditions were put into the heat-resistant metal growing vessel and sealed. Further, the growing vessel was held while being horizontally rotated for about 10 hours in the crystal growing furnace, into which a nitrogen gas was to be introduced, under the condition that the furnace temperature was 900° C. and the furnace pressure was 5 MPa.

The conductive GaN substrate was taken out of the alumina crucible after the growth, and then, it was confirmed that a GaN single crystal was deposited with a thickness of about 150 μm on the (0001) plane thereof an each condition.

Then, the surface of the GaN single crystals formed on the conductive GaN substrate was ground with diamond abrasive grains and was planarized to have a thickness of 25 μm. As a result, six types of composite substrates were obtained, each of which had the Zn-doped GaN layer 2A as the base layer 2 on the conductive GaN substrate. In any of the samples, no crack was found on the surface of the Zn-doped GaN layer 2A.

For each of the composite substrates, the Zn concentration of the Zn-doped GaN layer 2A was identified by SIMS, and the resistivity of the Zn-doped GaN layer 2A was measured by the van der Pauw method.

Table 1 shows the Zn concentration and resistivity of the Zn-doped GaN layer 2A (base layer) for each sample.

TABLE 1

| Sample No. | Zn concentration [/cm$^3$] | Resistivity [Ω · cm] | Mobility [cm$^2$/V · s] | Capacitance [pF] |
|---|---|---|---|---|
| 1-1 | <1 × 10$^{16}$ | 1 × 10$^1$ | 1850 | 120 |
| 1-2 | 5 × 10$^{17}$ | 3 × 10$^6$ | 1750 | 0.5 |
| 1-3 | 1 × 10$^{18}$ | 1 × 10$^7$ | 1600 | <0.1 |
| 1-4 | 1 × 10$^{19}$ | 3 × 10$^7$ | 1200 | <0.1 |
| 1-5 | 2 × 10$^{19}$ | 5 × 10$^7$ | 1150 | <0.1 |
| 1-6 | 3 × 10$^{19}$ | 1 × 10$^8$ | 650 | <0.1 |

As shown in Table 1, the Zn concentration of the Zn-doped GaN layer 2A had a larger value with a larger charging amount of the metal Zn. It was confirmed that the sample 1-1 actually contained no Zn because the measured value of Zn concentration was less than the lower detection limit, 1×10$^{16}$/cm$^3$.

The resistivity of the Zn-doped GaN layer 2A was 1×10$^6$ Ω·cm or more except for the sample 1-1 and had a larger value with a higher Zn concentration. In particular, the values of 1×10$^7$ Ω·cm or more were obtained in the samples 1-3 to 1-6. This confirmed that the Zn-doped GaN layer 2A was formed as a semi-insulating layer in the samples 1-2 to 1-6.

Each of the thus obtained composite substrates was placed in the susceptor in the reactor of the MOCVD furnace. After the internal gas of the reactor was replaced with a nitrogen gas, the reactor pressure was set to 100 kPa, thereby forming an atmosphere in hydrogen/nitrogen mixed flow state. Subsequently, the susceptor was heated to raise the temperature of the substrate. When the susceptor temperature reached 1100° C., a TMG gas and an ammonia gas were introduced into the reactor, thereby forming a GaN layer as the channel layer 3 to have a thickness of 2 nm.

In the formation of the channel layer 3, a hydrogen gas was used as the bubbling gas for a metal organic source and the carrier gas. The gas ratio of group 15 to group 13 was set to 2000.

The C concentrations of the samples, which have undergone the process up to the formation of the channel layer 3 on the same conditions, were measured by SIMS, so that the C concentration of each sample was about $2 \times 10^{16}/cm^3$. This confirmed that the channel layer 3 was formed as a low-impurity layer. The lower detection limit of the C concentration in the SIMS measurement was $1 \times 10^{16}/cm^3$.

After the channel layer 3 was obtained, then, the susceptor temperature was continuously kept at 1100° C., and the reactor pressure was set to 10 kPa. Subsequently, TMG, TMA, and an ammonia gas were introduced into the reactor at a predetermined flow rate ratio, thereby forming an $Al_{0.2}Ga_{0.8}N$ layer as the barrier layer 4 to have a thickness of 25 nm. In the formation of the barrier layer 4, a hydrogen gas was used as the bubbling gas for the metal organic source and the carrier gas. The gas ratio of group 15 to group 13 was 5000.

After the formation of the barrier layer 4, the susceptor temperature was lowered to around room temperature, and the internal gas of the reactor was returned to atmospheric pressure. Then, the reactor was opened to the air, thereby taking out the produced group 13 nitride composite substrate 10.

Then, the mobility of the HEMT structure formed on the group 13 nitride composite substrate 10 was measured by Hall measurement (van der Pauw method).

Specifically, a 6 mm×6 mm square specimen was cut out from each of the six types of group 13 nitride composite substrates 10. Subsequently, 0.5 mm×0.5 mm square Ti/Al electrodes were deposited on the four corners of the specimen, and were then annealed for one minute at 600° C. in a nitrogen gas. Then, the temperature was lowered to room temperature, thereby obtaining samples for measurement. After confirming that ohmic contact has been provided between the Ti/Al electrodes and the HEMT structure, the mobility of the HEMT structure was measured by Hall measurement. Table 1 also shows the measurement results of the mobility.

Subsequently, the HEMT device 20 was manufactured using the group 13 nitride composite substrate 10. The HEMT device 20 was designed to have a gate width of 1 mm, a source-gate distance of 1 μm, a gate-drain distance of 7.5 μm, and a gate length of 1.5 μm.

In the production of the HEMT device 20, prior to the formation of the electrodes, a SiN film (not shown) was formed with a thickness of 100 nm as a passivation film on the group 13 nitride composite substrate 10 (on the barrier layer 4).

Subsequently, the SiN film formed at the locations at which the source electrode 5, the drain electrode 6, and the gate electrode 7 were to be formed was etched by photolithography, thereby obtaining a SiN pattern.

Then, the source electrode 5 and the drain electrode 6 were formed.

Specifically, first, a multilayer metal pattern of Ti/Al/Ni/Au (film thickness thereof is 25/75/15/100 nm) was formed at the predetermined locations for formation by the vacuum deposition method and the photolithography process, thereby forming the electrodes 5 and 6. After that, for improved ohmic property of the source electrode 5 and the drain electrode 6, heat treatment was performed for 30 seconds at 800° C. in a nitrogen gas atmosphere.

Subsequently, the gate electrode 7 was formed. Specifically, a Schottky metal pattern of Pd/Au (film thickness thereof is 30/100 nm) was formed at the predetermined locations for formation by the vacuum deposition method and the photolithography process, thereby forming the gate electrode 7.

Finally, the substrate was cut into pieces on a device-by-device basis by dicing, thereby obtaining the HEMT devices 20.

The gate-source capacitance of the obtained HEMT device 20 was measured. Table 1 also shows the measurement results of the gate-source capacitance of each sample.

The results shown in Table 1 confirm that a gate-source capacitance of 0.5 pF or less is obtained in the HEMT devices of Nos. 1-2 to 1-6, in which the resistivity of the Zn-doped GaN layer 2A is $1 \times 10^6$ Ω·cm or more, and that a mobility as high as 1000 $cm^2/V \cdot s$ or more and a gate-source capacitance as small as 0.1 pF or less are obtained in the HEMT devices of Nos. 1-3 to 1-5, in which the range of the Zn concentration of the Zn-doped GaN layer 2A is from $1 \times 10^{18}/cm^3$ or more to $2 \times 10^{19}/cm^3$ or less.

It is also confirmed that the gate-source capacitance does not always decrease sufficiently in the HEMT devices of Nos. 1-1 and 1-2 in which the Zn concentration is smaller than $1 \times 10^{18}/cm^3$ while the mobility decreases in the HEMT device of No. 1-6 in which the Zn concentration is larger than $2 \times 10^{19}/cm^3$.

Example 2

In this example, a group 13 nitride composite substrate 10 including a C-containing GaN layer 2B as a base layer 2 was produced, and further, the group 13 nitride composite substrate 10 was used to produce a HEMT device 20. Five types of group 13 nitride composite substrates 10 were produced on different conditions for the C concentration of the C-containing GaN layer 2B, and HEMT devices 20 for the respective substrates 10 were produced (Nos. 2-1 to 2-5). The production procedure was similar to that of Example 1 except for that the C-containing GaN layer 2B, the channel layer 3, and the bather layer 4 were formed sequentially in a single MOCVD furnace. Then, the characteristics were evaluated during and after the production.

In the production of the sample on each condition, a conductive GaN substrate similar to that used in Example 1 was placed in the susceptor in the reactor of the MOCVD furnace. After that, the internal gas of the reactor was replaced with a nitrogen gas, and then, an atmosphere in hydrogen/nitrogen mixed flow state was formed. Subsequently, the susceptor was heated to raise the temperature of the substrate. When the susceptor temperature reached 1100° C., a TMG gas and an ammonia gas were introduced into the reactor, thereby forming a GaN layer to have a thickness of 10 μm. On that occasion, for different C concentrations, the reactor pressure and the gas ratio of group 15 to group 13 were differentiated for each sample. Specifically, the reactor pressure was set to 100 kPa, 50 kPa, 50 kPa, 10 kPa, and 10 kPa for the samples 2-1 to 2-5, respectively. The gas ratio of group 15 to group 13 was set to 1000, 2000, 500, 200, and 100 for the samples 2-1 to 2-5, respectively. A hydrogen gas was used as the bubbling gas for a metal organic material and the carrier gas in the formation of the C-containing GaN layer 2B.

After the formation of the C-containing GaN layer 2B, C concentration thereof was measured by SIMS.

After that, the procedure from forming the channel layer 3 to finally obtaining the HEMT device 20 was similar to that of Example 1. The mobility and the gate-source capacitance were measured as in Example 1.

Table 2 shows the C concentration and resistivity of the C-containing GaN layer 2B, and mobility and gate-source capacitance of HEMT for each sample.

TABLE 2

| Sample No. | C concentration [/cm$^3$] | Resistivity [Ω·cm] | Mobility [cm$^2$/V·s] | Capacitance [pF] |
|---|---|---|---|---|
| 2-1 | $5 \times 10^{16}$ | $3 \times 10^3$ | 1800 | 2.5 |
| 2-2 | $8 \times 10^{16}$ | $3 \times 10^6$ | 1600 | <0.1 |
| 2-3 | $2 \times 10^{17}$ | $4 \times 10^6$ | 1550 | <0.1 |
| 2-4 | $3 \times 10^{18}$ | $6 \times 10^6$ | 1250 | <0.1 |
| 2-5 | $5 \times 10^{18}$ | $4 \times 10^7$ | 950 | <0.1 |

The results shown in Table 2 confirm that a resistivity of $1 \times 10^6$ Ω·cm or more is obtained in the HEMT devices of Nos. 2-2 to 2-5 in which the range of the C concentration of the C-containing GaN layer 2B is from $8 \times 10^{16}/cm^3$ or more and that a mobility as high as 1000 cm$^2$/V·s or more and a gate-source capacitance as small as 0.1 pF or less are obtained in the HEMT devices of Nos. 2-2 to 2-4 in which the range of the C concentration of the C-containing GaN layer 2B is from $8 \times 10^{16}/cm^3$ or more to $3 \times 10^{18}/cm^3$ or less.

It is also confirmed that the gate-source capacitance does not always decrease sufficiently in the HEMT device of No. 2-1 in which the C concentration is smaller than $8 \times 10^{16}/cm^3$ and that the mobility decreases in the HEMT device of No. 2-5 in which the C concentration is larger than $3 \times 10^{18}/cm^3$.

Example 3

In this example, a group 13 nitride composite substrate 10 including an AlGaN layer 2C having a composition $Al_pGa_{1-p}N$ as the base layer 2 was produced, and further, the group 13 nitride composite substrate 10 was used to produce the HEMT device 20.

Six types of group 13 nitride composite substrates 10 were produced on different conditions for the Al compositional ratio p of the AlGaN layer 2C, and HEMT devices 20 for the respective substrates 10 were produced (Nos. 3-1 to 3-6). The production procedure was similar to that of Example 1 except for that the AlGaN layer 2C, the channel layer 3, and the barrier layer 4 were formed sequentially in a single MOCVD furnace. Then, the characteristics were evaluated during and after the production.

In the production of the sample on each condition, a conductive GaN substrate similar to that used in Example 1 was placed in the susceptor in the reactor of the MOCVD furnace. After that, the internal gas of the reactor was replaced with a nitrogen gas, and then, and the reactor pressure was set to 10 kPa, thereby forming an atmosphere in hydrogen/nitrogen mixed flow state. Subsequently, the susceptor was heated to raise the temperature of the substrate. When the susceptor temperature reached 1100° C., a TMG gas, a TMA gas, and an ammonia gas were introduced into the reactor, thereby forming an AlGaN layer 2C to have a thickness of 0.2 μm. On that occasion, for different Al compositional ratios p, the TMA/(TMA+TMG) ratio was differentiated for each sample. Specifically, the TMA/(TMA+TMG) ratio was set to 0.08, 0.1, 0.2, 0.5, 0.98, and 1 for the samples 3-1 to 3-6, respectively. A hydrogen gas was used as the bubbling gas for a metal organic material and the carrier gas in the formation of the AlGaN layer 2C.

After that, the procedure from forming the channel layer 3 to finally obtaining the HEMT device 20 was similar to that of Example 1. The mobility and the gate-source capacitance were measured as in Example 1.

Table 3 shows the Al composition ratio p and resistivity of the AlGaN layer 2C (base layer), and mobility and gate-source capacitance of HEMT for each sample.

TABLE 3

| Sample No. | Al composition ratio p | Resistivity [Ω·cm] | Mobility [cm$^2$/V·s] | Capacitance [pF] |
|---|---|---|---|---|
| 3-1 | 0.08 | $2 \times 10^5$ | 1800 | 0.6 |
| 3-2 | 0.1 | $2 \times 10^6$ | 1600 | <0.1 |
| 3-3 | 0.2 | $3 \times 10^6$ | 1550 | <0.1 |
| 3-4 | 0.5 | $6 \times 10^6$ | 1400 | <0.1 |
| 3-5 | 0.98 | $2 \times 10^7$ | 1050 | <0.1 |
| 3-6 | 1 | $6 \times 10^7$ | 850 | <0.1 |

The results shown in Table 3 confirm that a resistivity of $1 \times 10^6$ Ω·cm or more is obtained in the HEMT devices of Nos. 3-2 to 3-6 in which the range of the Al compositional ratio p of the AlGaN layer 2C is 0.1 or more and that a mobility as high as 1000 cm$^2$/V·s or more and a gate-source capacitance as small as 0.1 pF or less are obtained in the HEMT devices of Nos. 3-2 to 3-5 in which the range of the Al compositional ratio p of the AlGaN layer 2C is from 0.1 or more to 0.98 or less.

It is also confirmed that the gate-source capacitance does not always decrease sufficiently in the HEMT device of No. 3-1 in which the C concentration is smaller than 0.1 while the mobility decreases in the device of No. 3-6 in which the C concentration is larger than 0.98. The HEMT device of No. 3-6 where p=1 is the sample including the base layer 2 of AlN.

Comparative Example 1

A HEMT device was produced as in Example 1 (also as in Examples 2 and 3) except for that no base layer 2 was formed and the HEMT structure was provided directly on the base material 1.

The gate-source capacitance of the obtained HEMT device was measured, which was 50 pF.

This result reveals that providing the base layer 2 as in Examples 1 to 3 is effective for reducing the parasitic capacitance of the HEMT device.

Comparative Example 2

A 15 mm×15 mm square semi-insulating GaN substrate having a resistivity of $1 \times 10^6$ Ω·cm or more and a (0001) plane orientation was prepared in place of the conductive GaN substrate used as the base material 1 in Examples 1 to 3 and Comparative Example 1, and the substrate was used to produce a HEMT device without forming the base layer 2 as in Comparative Example 1.

During the production, the mobility and the gate-source capacitance were measured as in Examples 1 to 3. As a result, the mobility was 1500 cm$^2$/V·s and the gate-source capacitance was less than 0.1 pF.

The results above reveal that even in the case where a conductive GaN substrate is used as the base material 1 as in Examples 1 to 3, a HEMT device suitable for high-frequency applications, having characteristics comparable to those of the HEMT device having a HEMT structure provided directly on the semi-insulating GaN substrate, is obtained by providing the base layer 2 between the channel layer 3b and the base material 1 on a predetermined condition.

Comparative Example 3

HEMT devices were produced as in Nos. 2-3 and 2-4 of Example 2 except for that after the formation of a C-containing GaN layer 2B as the base layer 2, a channel layer 3 was formed to have the same C concentration as that of the C-containing GaN layer 2B. The total thickness of the base layer 2 and the channel layer 3 was set to 12 μm. The sample produced on the condition corresponding to No. 2-3 will be referred to as No. 2-3a and the sample produced on the condition corresponding to No. 2-4 will be referred to as No. 2-4a.

During the production, the mobility and the gate-source capacitance were measured as in Examples 1 to 3.

Table 4 shows the C concentration and resistivity of the base layer (and the channel layer), and the mobility and the gate-source capacitance of HEMT for each sample.

TABLE 4

| Sample No. | C concentration [/cm$^3$] | Resistivity [Ω·cm] | Mobility [cm$^2$/V·s] | Capacitance [pF] |
|---|---|---|---|---|
| 2-3a | $2 \times 10^{17}$ | $4 \times 10^6$ | 900 | <0.1 |
| 2-4a | $3 \times 10^{18}$ | $6 \times 10^6$ | 750 | <0.1 |

As a result of the comparison between the results of the HEMT devices of Nos. 2-3a and 2-4a shown in Table 4 and the results of the HEMT devices of Nos. 2-3 and 2-4 in Example 2 shown in Table 2, the gate-source capacitance was reduced to less than 0.1 pF similarly to the HEMT devices of Nos. 2-3 and 2-4, but the mobility fell below 1000 cm$^2$/V·s.

These results indicate that to obtain a HEMT device suitable for high-frequency applications, it is preferable to form a base layer 2 containing a relatively high concentration of C on a conductive base material 1 and then provide a channel layer 3 containing a low concentration of impurities (substantially containing a relatively low concentration of C).

The invention claimed is:

1. A group 13 nitride composite substrate, comprising:
   a base material of an n-conductivity type formed of GaN;
   a base layer located directly on said base material, said base layer being a Zn-doped GaN layer which is a GaN layer containing Zn doped at a density of $1 \times 10^{18}$/cm$^3$ or more and $2 \times 10^{19}$/cm$^3$ or less and having a resistivity of $1 \times 10^7$ Ω·cm or more and $5 \times 10^7$ Ω·cm or less;
   a channel layer located on said base layer, said channel layer being a GaN layer having a total impurity concentration of $1 \times 10^{17}$/cm$^3$ or less; and
   a barrier layer located on said channel layer, said barrier layer being formed of a group 13 nitride having a composition $Al_xIn_yGa_{1-x-y}N$ ($0 \leq x \leq 1$, $0 \leq y \leq 1$).

2. A method for manufacturing a group 13 nitride composite substrate, comprising:
   a base layer forming step of forming, on a base material of an n-conductivity type formed of GaN, said base layer being a Zn-doped GaN layer which is a GaN layer containing Zn doped at a density of $1 \times 10^{18}$/cm$^3$ or more and $2 \times 10^{19}$/cm$^3$ or less and having a resistivity of $1 \times 10^7$ Ωcm or more and $5 \times 10^7$ Ωcm or less;
   a channel layer forming step of forming, on said base layer, a channel layer being a GaN layer having a total impurity concentration of $1 \times 10^{17}$/cm$^3$ or less; and
   a barrier layer forming step of forming, on said channel layer, a barrier layer formed of a group 13 nitride having a composition $Al_xIn_yGa_{1-x-y}N$ ($0 \leq x \leq 1$, $0 \leq y \leq 1$).

* * * * *